US005751600A

United States Patent [19]
Ochi et al.

[11] Patent Number: 5,751,600
[45] Date of Patent: May 12, 1998

[54] METHOD AND APPARATUS FOR THE ANALYSIS OF ELECTROMAGNETICS

[75] Inventors: Hisaaki Ochi; Etsuji Yamamoto, both of Tokyo; Kumio Sawaya; Saburo Adachi, both of Sendai, all of Japan

[73] Assignee: Hitachi, Ltd., Tokyo, Japan

[21] Appl. No.: 671,255

[22] Filed: Jun. 26, 1996

[30] Foreign Application Priority Data

Jun. 28, 1995 [JP] Japan .................................. 7-161742

[51] Int. Cl.$^6$ .................................................. G01R 29/08
[52] U.S. Cl. ........................ 364/524; 364/578; 364/802; 364/481; 364/488; 343/703
[58] Field of Search ........................ 364/524, 578, 364/802, 480–483, 488, 489, 512, 550, 551.01, 552, 573, 580, 838, 809; 343/703, 700 MS, 795, 824, 825; 607/156, 103; 324/260, 261, 207.16, 207.24; 128/653.1, 731, 734; 336/232, 218

[56] References Cited

U.S. PATENT DOCUMENTS

| 4,319,249 | 3/1982 | Evans et al. ........................ 343/703 |
| 5,198,821 | 3/1993 | Skrzypczak ........................ 343/703 |
| 5,243,984 | 9/1993 | Ogura et al. ........................ 128/653.1 |

OTHER PUBLICATIONS

IEEE Transactions on Antennas and Propagations, vol. AP-23, No. 3, May 1975, "Mutual Impedance of Non-Planar-Skew Sinusoidal Dipoles", Richmond et al, pp. 412–414.

IEEE Transactions on Antennas and Propagations, vol. AP-26, No. 6, Nov. 1978, "Electromagnetic Modeling of Composite Wire and Surface Geometries", Newman, pp. 784–789.

*Primary Examiner*—Emanuel T. Voeltz
*Assistant Examiner*—Hal P. Wachsman
*Attorney, Agent, or Firm*—Fay, Sharpe, Beall, Fagan, Minnich & McKee

[57] ABSTRACT

Analysis of electromagnetics for an antenna analyzes a current on a conductor having a junction between a linear conductor and a planar conductor relying upon a moment method. A planar dipole segment 9 includes a planar monopole 91-2 in which the current flows in the same direction as the current flowing through part of a quadrangle 41-2-4 of a radial segment 41, and a planar monopole 91-1 in which the current flows in the same direction as the current flowing in a planar monopole 35-1 of a planar dipole segment 35. In the vicinity of the junction between the linear conductor and the planar conductor, currents are expressed that flow through the vicinity of the junction where three segments consisting of a radial segment and two planar dipole segments are overlapped one upon the other.

14 Claims, 8 Drawing Sheets

⇩ : PLANAR CURRENT

METHOD AND APPARATUS FOR THE ANALYSIS OF ELECTROMAGNETICS

FIELD OF THE INVENTION

The present invention relates to a method of analyzing electromagnetics in relation to analyzing antennas used in the field of electronic communications devices and in the field of medical treatment apparatuses such as MRI and hyperthermia, and in relation to analyzing electromagnetic interactions among the printed lines on an electronic circuit, and to an apparatus therefor.

BACKGROUND OF THE INVENTION

In solving scattering problems in electromagnetic waves and in designing antennas, an analytical technique has heretofore been carried out based upon a moment method. The moment method is a method of analyzing electromagnetics by expanding an electric current flowing through a conductor using a predetermined function and transforming integral equations related to an electric field established on the surface of the conductor into simultaneous equations in order to find a current distribution on the conductor. According to the moment method, a variety of expansion functions are used depending upon the object that is to be analyzed. Briefly described below is the Richmond's moment method that is effective in the analysis of an antenna constituted by linear conductors.

Referring to FIG. 1, the linear conductor shown can be regarded as a wire which, though it really has a thickness like a wire or a printed line, has a very small thickness compared to the wavelengths that are emitted. According to Richmond's moment method, an antenna constituted by such a linear conductor is divided into a plurality of V-shaped dipole segments 17, 17'. Each of the V-shaped (linear) dipole segments consists of two connected monopoles.

The V-shaped dipole segment 17 consists of a monopole 17-1 and a monopole 17-2, and the V-shaped dipole segment 17' consists of a monopole 17-3 and a monopole 17-4. The monopole 17-1 and the monopole 17-3 are partially overlapping. Either two adjacent monopoles are partially overlapping, or if two adjacent monopoles are of the same length, they are perfectly overlapping.

A sinusoidal function (1) given below is introduced as a function for mathematically expanding, on the segments, a current flowing through the antenna, Equation 1
$$f(\xi) = \xi' \sin \{k(h_1 + \xi)\}/\sin (kh_1) \quad : -h_1 \leq \xi \leq 0$$
$$f(\xi) = \xi' \sin \{k(h_2 - \xi)\}/\sin (kh_2) \quad : 0 \leq \xi \leq h_2 \quad (1)$$

where $\xi$ is a coordinate on a segment axis 11, i.e., a coordinate in the direction of the flow of current, $\xi'$ is a unit vector 12 in the direction of the flow of current, and k is a wave number in free space.

In compliance with the Galerkin method, the integral equation which holds for the surface of the antenna conductor can be transformed into a matrix equation (2) as given below, Equation 2
$$\Sigma Z_{ij} I_j = V_i ; i=1, 2, \ldots, N \quad (2)$$

where N is a number of the dipole segments, $V_i$ is a voltage applied to an i-th dipole segment (0 on a dipole segment to which no voltage is applied), $I_j$ is an unknown coefficient electric current flowing in a j-th dipole segment, $Z_{ij}$ is a self or mutual impedance between the i-th dipole segment and the j-th dipole segment, and $\Sigma$ denotes the sum of from j=1 to j=N.

The self or mutual impedance can be calculated by the method disclosed in the journal reference: IEEE Trans. Antennas Propagat., Vol. AP-23, 3, pp. 412–414 (1975).

Numerical solution of the matrix equation (2) makes it possible to find a current distribution on the antenna and, hence, to easily calculate the input impedance and the electromagnetic distribution (J. H. Richmond and N. H. Greary: "Mutual Impedance of Non-Planar-Skew Sinusoidal Dipoles", IEEE Trans. Antennas Propagat., Vol. AP-23, 3, pp. 412–414 (1975)).

Described below is an example of an analysis of an antenna by the Richmond's moment method using a computer. First, the antenna is divided into N dipole segments manually or automatically using a computer program, and functions expressing the dipole segments are stored in a data memory. Here, the function expressing a dipole segment includes data capable of defining a dipole segment, i.e., data expressing a coordinate and an expansion function in real space in which the dipole segment exists. According to the Richmond's moment method, a dipole segment can be defined if the equation (1) and a coordinate in real space of the dipole segment are determined and stored. Next, it is confirmed whether the dipole segment is correctly determined and stored or not, either manually or automatically using the computer program. Generally, functions or data expressing N dipole segments are read out from the data memory, and positions of N dipole segments in real space are displayed so as to be confirmed. After it is confirmed that the dipole segments have been correctly determined and stored, a self or mutual impedance is calculated among the dipole segments to form a matrix equation (2) which is then solved to find unknown electric current coefficients for each of the dipole segments.

The methods for analyzing an antenna having a planar conductor include a moment method which divides a current flowing on the planar conductor into currents of two directions and expands the currents of the two directions on the whole region using a function, and a method wherein as shown in FIG. 2, the current on the planar conductor 2 is expanded into currents of two directions flowing on the planar dipole segments, and to which the Richmond's moment method or the Galerkin's method is applied.

The planar dipole segment may be a planar dipole segment 35 constituted of a quadrangular planar monopole 35-1 and a quadrangular planar monopole 35-2 as shown in FIG. 3. In FIG. 3, a planar dipole segment 35' overlapping the planar dipole segment 35 is shown. The planar dipole segment 35' consists of a planar monopole 35-1 and a planar monopole 35-3, and the planar monopole 35-1, 35-2, and 35-3 are in a same plane. A current density at a given point (a) (shown on the quadrangular planar monopole 35-1 in FIG. 3) on a given current path on the segment is defined by the following equation (3), Equation 3
$$f(\xi) = \xi' \sin \{k(h_1 + \xi)\}/\{w(\xi/h_1) \sin (kh_1)\} \quad : -h_1 \leq \xi \leq 0$$
$$f(\xi) = \xi' \sin \{k(h_2 - \xi)\}/\{w(\xi/h_2) \sin (kh_2)\} \quad : 0 < \xi \leq h_2 \quad (3)$$

where $\xi$ is a coordinate on a segment axis 31, i.e., a coordinate in the direction of flow of current and $\xi'$ is a unit vector 32 in the direction of flow of current.

In FIG. 3, it is presumed that the direction of flow of current satisfies a relationship of the following equation (4), Equation 4

$$d_1/L_1 = d_2/L_2 = d_3/L_3 \quad (4)$$

where $w(\xi/h_1)$ is the width of the planar monopole at the point (a), and where $w(\xi/h_2)$ is width of the planar monopole at the point (a'); $w(\xi/h_1)$ is a length of a line connecting the points at which the distances from the common side of the quadrangular planar monopoles 35-1 and 35-2 is "current path$\times\xi/h_1$" on all current paths on the planar monopole 35-1, and $w(\xi/h_2)$ is a length of a line connecting the points at which the distances from the common side of the quadrangular planar monopoles 35-1 and 35-2 is "current path$\times\xi/h_2$" on all current paths on the planar monopole 35-2. $\xi$ is the coordinate in the direction of flow of current.

The self and mutual impedances of the planar dipole segment are found, and are substituted for the equation (2) to numerically solve the matrix equations to find a current distribution on the antenna.

As a method of analyzing an antenna having a junction of a linear conductor and a planar conductor, furthermore, there has been employed a method in which a current flowing through the vicinity of the junction of the linear conductor and the planar conductor is expanded as a current that flows, as shown in FIG. 4, through a radial segment 41 constituted of a monopole 41-1, which is one of a plurality of segments of the linear conductor and is joined to the planar conductor, and a radial monopole 41-2, which is one of a plurality of segments of the planar conductor 2 and is joined to the linear conductor (E. H. Newman: "Electromagnetic Modeling of Composite Wire and Surface Geometries", IEEE Trans. Antennas Propagat., Vol. AP-26, 6, pp. 784–789 (Nov. 1978)). According to Newman et al., when the wavelength of the electromagnetic waves that are emitted from or received by an antenna is $\lambda$, the radius R (FIG. 4) of the radial monopole 41-2 must be selected to be 0.1 to 0.25$\lambda$. In FIG. 4, the monopole 41-1 and the radial monopole 41-2 are not in the same plane. It is assumed that a linear monopole and a radial monopole are connected electrically. In the radial monopole, electric currents flow in radial directions into or from the junction region between the planar conductor and the linear conductor.

This method is effective when the size of the planar conductor 2 is sufficiently larger than the wavelength $\lambda$ of the electromagnetic waves emitted from or received by the antenna. However, this method is not applicable when the size of the conducting plane is smaller than 0.2$\lambda$, i.e., when the end of the conducting plane exists within a radius of 0.1$\lambda$ from the junction between the linear conductor and the planar conductor.

SUMMARY OF THE INVENTION

Consider the analysis possible according to the prior art for a monopole that stands at the center of a square conducting plane having a side of 0.15$\lambda$. When it is attempted to expand the current flowing through the vicinity of the junction of the linear conductor and the planar conductor as a current that flows through the radial dipole segment, the radius of the radial monopole 41-2 can only be increased up to 0.075$\lambda$ (i.e., up to one-half of the side of the square conducting plane).

This creates the potential for a problem when the known analysis method is applied to antennas used for portable telephones, for example, which operate in a frequency region that is typically 0.8 GHz_2 GHz, and therefore have signals with corresponding wavelengths of $\lambda$=15 cm_37.5 cm. In designing antennas for portable telephones, it is important to consider both the antenna and the conductor case of the portable telephone. That is, the conducting case has a great effect on the characteristics of the antenna. If a length in a thickness direction of the conductor case of a portable telephone is 1 cm_2 cm, then 0.25$\lambda$ is 3.8 cm_9.6 cm, and the above prior art analysis methods cannot be applied for the analysis of the characteristics of an antenna used for portable telephones having small size.

For an antenna having a junction of a linear conductor and a planar conductor, the electromagnetics cannot be analyzed by relying upon the moment method which simply expands the current flowing through the vicinity of the junction of the linear conductor and the planar conductor as a current flowing through the radial dipole segment if the end of the conducting plane exists within a radius 0.1$\lambda$ from the junction of the linear conductor and the planar conductor, since the antenna must be so divided that the radial monopole has a radius of from 0.1 to 0.25$\lambda$. Accordingly, an object of the present invention is to provide a method of analyzing the electromagnetics of such an antenna having a conducting plane of a size smaller than 0.2$\lambda$ and an apparatus for performing the analysis method.

According to the present invention, there is provided a method of analyzing the electromagnetics of an antenna in which the end of the conducting plane exists within a radius of 0.1$\lambda$ from the junction of a linear conductor and, planar conductor, as follows.

The antenna to be analyzed has a conductor having a junction of a linear conductor and a planar conductor that is divided into a plurality of dipole segments. The linear and planar conductors are placed in a different plane, wherein a current distribution function expressing a current in each of the dipole segments is expressed by a predetermined function. The plurality of dipole segments comprise a plurality of linear dipole segments divided from the linear conductor, a plurality of planar dipole segments divided from the planar conductor, and a radial dipole segment which consists of a linear monopole connected with said junction and a radial monopole connected with said junction. The adjacent linear dipole segments are overlapping, and the adjacent planar dipole segments are overlapping. The linear monopole is the same conductor portion of the monopole of the linear dipole segment connected to the junction. The radial monopole is divided into a plurality of regions, one of the divided regions of the radial monopole is the same conductor portion of a first monopole of a first planar dipole segment connected with said junction. Given the above, an integral equation relating to an electric field established on the surface of the conductor is transformed into simultaneous equations (2) for obtaining a current distribution of current flowing in the conductor of the antenna, which are then solved. The simultaneous equations 2 are as follows.

$$\sum_{j=1}^{N} Z_{ij} I_j = V_i \, (i = 1, 2, \ldots, N) \quad (2)$$

wherein N is a number of said dipole segments, $Z_{i,j}$ is a self or mutual impedance between an i-th dipole segment and a j-th dipole segment, $I_i$ is an unknown electric current coefficient of current flowing in the j-th dipole segment, and $V_i$ is a voltage applied to the i-th dipole segment. The improvement over the prior art in the analysis method for antennas of the invention includes: adding a second planar dipole segment to the plurality of dipole segments, wherein the second planar dipole segment includes a part of one of the divided regions of the radial monopole and a second monopole of the first planar dipole segment, the second monopole being connected with the part of one of the divided regions; and calculating a current distribution function expressing a current flowing in the second planar dipole segment from a current distribution function expressing a current flowing in the part of the one of the divided regions of the radial monopole and a current distribution function expressing a current flowing in the second monopole segment of the first planar dipole segment. Further, the current distribution of the current flowing in the conductor of the antenna is obtained using the unknown electric current coefficients of currents flowing in the dipole segments by solving the simultaneous equations.

According to the present invention, there is further provided an apparatus for analyzing the electromagnetics of an antenna. The apparatus includes a memory for storing each of the space coordinate positions of a plurality of dipole segments and each of a plurality of predetermined current distribution functions expressing a current in each of the dipole segments. The plurality of dipole segments are divided from a conductor of an antenna, the conductor having a junction of a linear conductor and a planar conductor. The linear and planar conductors are placed in a different plane, and the plurality of dipole segments have a plurality of linear dipole segments divided from the linear conductor, a plurality of planar dipole segments divided from the planar conductor, and a radial dipole segment which consists of a linear monopole connected with the junction and a radial monopole connected with the junction. The adjacent linear dipole segments are overlapping and the adjacent planar dipole segments are overlapping. The linear monopole is the same conductor portion of the monopole of the linear dipole segment connected with the junction. The radial monopole is divided into a plurality of regions, one of the divided regions of the radial monopole is the same conductor portion of a first monopole of a first planar dipole segment connected with the junction.

The apparatus of the invention also includes a calculation unit or computer for solving the simultaneous equations (2) for obtaining a current distribution of current flowing in the conductor of the antenna, wherein the simultaneous equations (2) are transformed from an integral equation relating to an electric field established on the surface of said conductor. The results of calculation by the calculation unit are displayed on the display unit. In particular, the memory stores the space coordinate positions of a second planar dipole segment in addition to each of the space coordinate positions of the plurality of dipole segments, and the second planar dipole segment includes a part of one of the divided regions of the radial monopole and a second monopole of the first dipole planar segment. The second monopole is connected with part of one of the divided regions. The calculation unit calculates a current distribution function expressing a current flowing in the second planar dipole segment from a current distribution function expressing a current flowing in part of one of the divided regions of the radial monopole and a current distribution function expressing a current flowing in the second monopole segment of the first planar dipole segment. Further, the current distribution of current flowing in the conductor of the antenna is obtained using the unknown electric current coefficients of currents flowing in the dipole segments by solving the simultaneous equations.

In the above invention, when $\lambda$ is the electromagnetic wave emitted or received by the antenna, at least one of the next conditions are satisfied. The conditions are: (I) the size (this size is the maximum length of current path flowing on the radial monopole) of the radial monopole is not longer than $0.1\lambda$; (II) the end of the planar dipole segment is within a radius of $0.1\lambda$ from the junction; (III) a shape of each of said planar dipole segments is a quadrangle, and a length of each of the sides of each of the quadrangles is not longer than $0.1\lambda$; (IV) the radial monopole connected with the junction includes four planar monopoles each having a shape of a quadrangle, and a center axis of the radial monopole connected with the junction passes through a vertex common to the four quadrangles; and (V) the radial monopole connected with the junction includes four planar monopoles each having a shape of a quadrangle, with a center axis passing through the vertex common to the four quadrangles.

According to the present invention, furthermore, there is provided an improved method of analyzing electromagnetics of an antenna which includes: 1) dividing a conductor of an antenna, the conductor having junction of a first and a second planar conductors, into a plurality of dipoles segments, the first and second planar conductors being placed in a different plane, wherein a current distribution function expressing a current in each of said dipole segments is expressed in a predetermined function, wherein the plurality of dipole segments comprise a plurality of planar dipole segments divided from the first planar conductor, a plurality of linear dipole segments divided from a linear conductor which is assumed to be equivalent to the second planar conductor, and a radial dipole segment which consists of a linear monopole connected with said junction and a radial monopole connected with said junction, the adjacent linear dipole segments are overlapping, and the adjacent planar dipole segments are overlapping, said linear monopole is the same conductor portion of the monopole of the linear dipole segment connected with said junction, said radial monopole is divided into a plurality of regions, one of the divided region of said radial monopole is the same conductor portion of a first monopole of a first planar dipole segment connected with said junction; 2) transforming an integral equation relating to an electric field established on the surface of said conductor into the above simultaneous equations (2) for obtaining a current distribution of current flowing in said conductor of said antenna; and 3) solving the simultaneous equations. The invention further includes: 4) adding a second planar dipole segment to said plurality of dipole segments, wherein said second planar dipole segment includes a part of said one of the divided region of said radial monopole and a second monopole of said first planar dipole segment, the second monopole is connected with the part of said one of the divided region; and 5) calculating a current distribution function expressing a current flowing in said second planar dipole segment from a current distribution function expressing a current flowing in said part of said one of the divided region of said radial monopole and a current distribution function expressing a current flowing in said second monopole segment of said first planar dipole segment;

wherein the current distribution of current flowing in said conductor of said antenna is obtained using the unknown electric current coefficients of currents flowing in the dipole segments by solving the simultaneous equations.

That is, in analyzing the antenna having a junction of the linear conductor and the planar conductor, a current flowing through the periphery of the junction of the linear conductor and the planar conductor is expanded by using a planar dipole segment having a portion in which the direction of current flowing through a first planar monopole is in agreement with the direction of current radially flowing through the radial segment and a portion in which the direction of current flowing through the first planar monopole is in agreement with the direction of current flowing through a second planar monopole continuous to the first planar monopole, in addition to using a conventional radial segment constituted by a monopole which is one of a plurality of segments of the linear conductor and is joined to the planar conductor, and a radial monopole which is one of a plurality of segments of the planar conductor and is joined to the linear conductor.

According to the present invention, furthermore, there is provided a method of analyzing electromagnetics by expanding, using a predetermined function, an electric current flowing through a conductor having a junction of two planar conductors as currents flowing, respectively, through the two planar conductors, and expanding an electric current flowing through the vicinity of the junction of the two planar conductors using a plurality of radial segments consisting of monopoles and radial monopoles, and transforming an integral equation related to an electric field established in the conductor region into simultaneous equations in order to find a current distribution in the conductor region, wherein the electric current flowing through the vicinity of the junction of the two planar conductors is expanded by using a planar segment consisting of a first planar segment and a second planar segment continuous to the first planar segment in addition to using a radial segment, and wherein a function expansion expressing an electric current that flows through the first planar segment includes a function expansion portion expressing a current that flows through part of the radial segment and a function expansion portion expressing a current that flows through part of the second planar segment.

When the electromagnetic wave emitted from or received by the antenna has a wavelength λ, the direction of current flowing on the planar conductor and the direction of current radially flowing through the radial dipole segment are set to be the same making it possible to analyze the antenna having a junction of a linear conductor and a planar conductor relying upon the moment method even when a radius of the radial monopole of the radial dipole segment is not larger than 0.1λ and the current radially flows in the radial monopole.

DETAILED DESCRIPTION OF THE PREFERRED EMBODIMENTS

Figure 1:
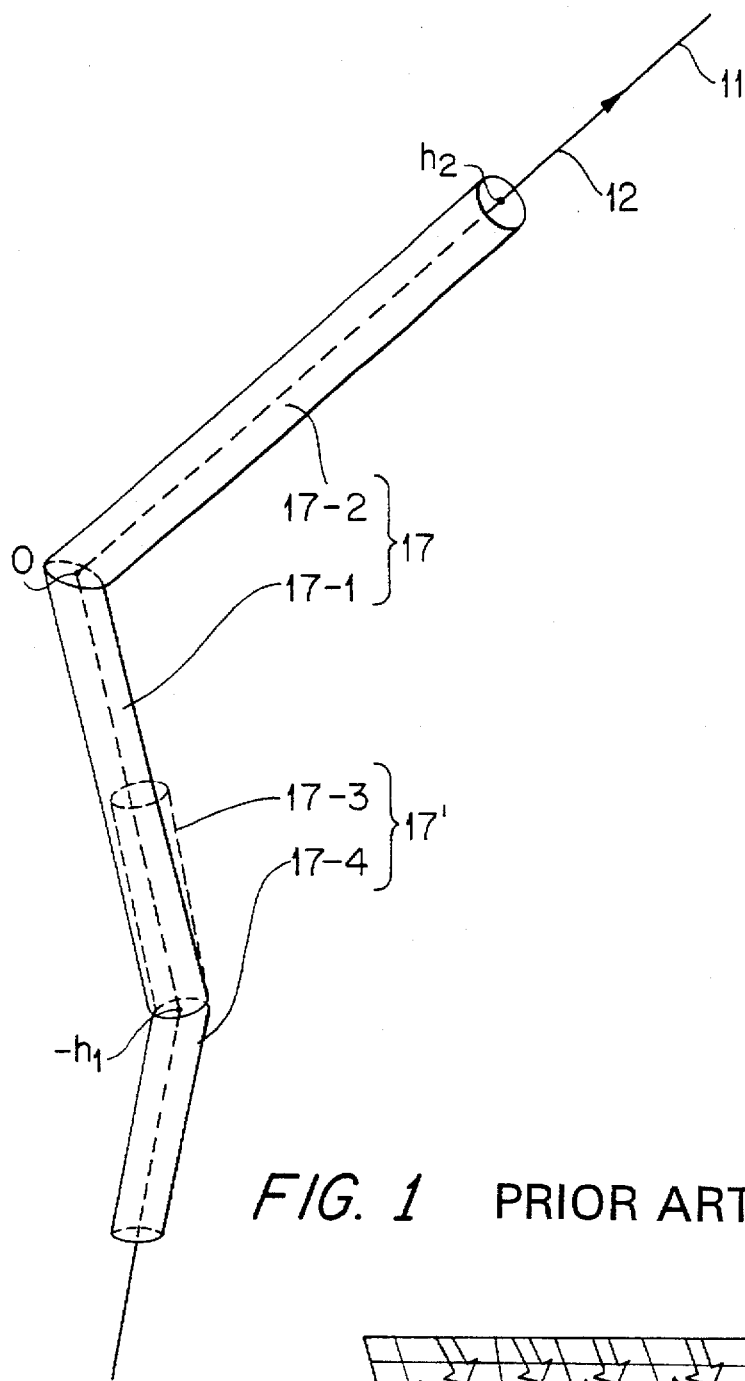
FIG. 1 is a diagram illustrating a plurality of V-shaped dipole segments.
Figure 2:
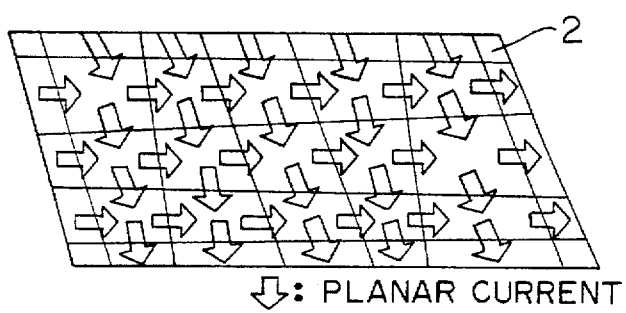
FIG. 2 is a diagram of when a current on a planar conductor is developed using planar dipole segments of two directions.
Figure 3:
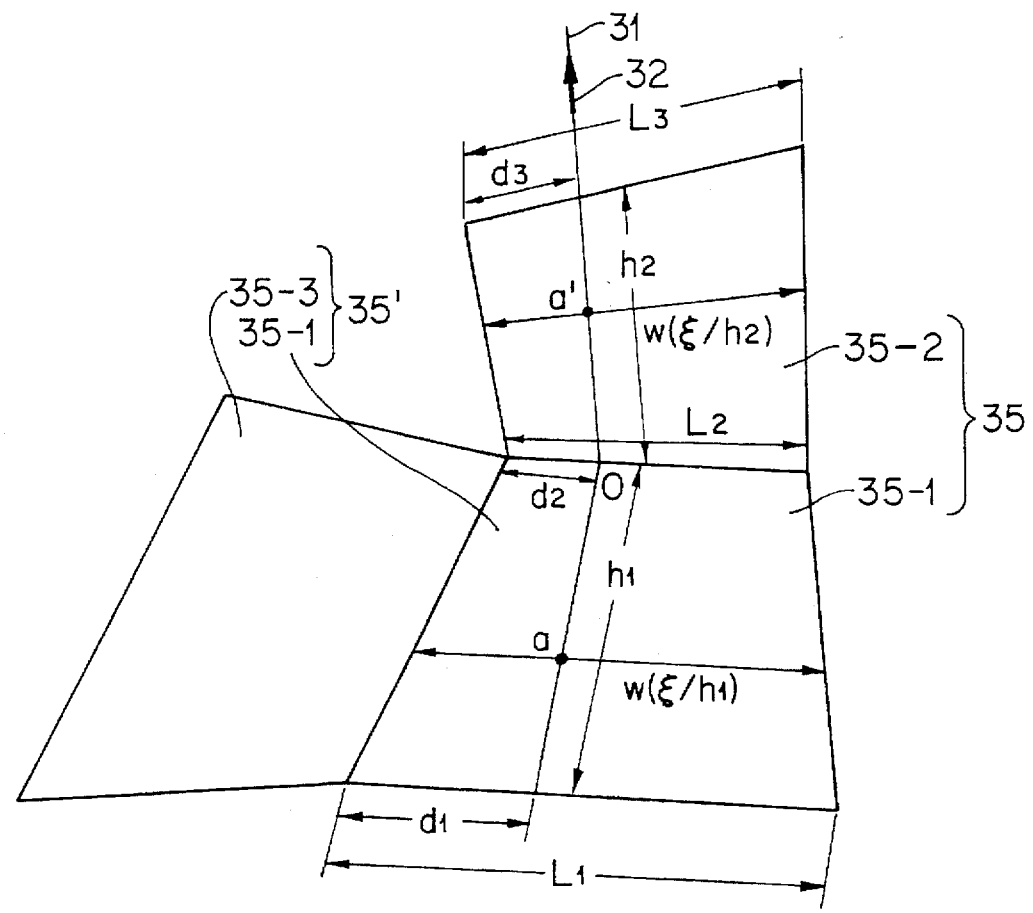
FIG. 3 is a diagram illustrating current paths on a planar dipole segment.
Figure 4:
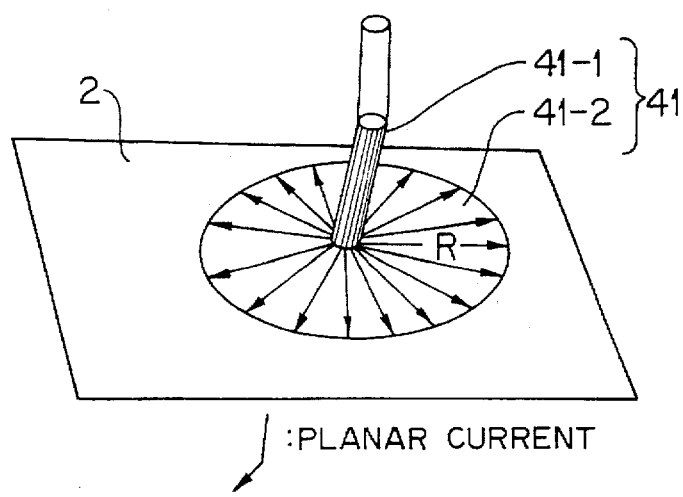
FIG. 4 is a diagram illustrating a radial monopole.
Figure 5:
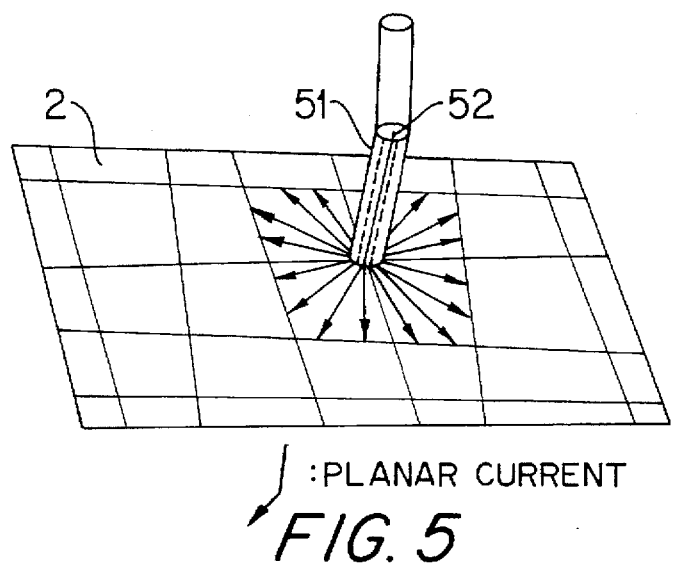
FIG. 5 is a diagram illustrating a portion of an antenna to be analyzed that is divided according to an embodiment of the present invention.
Figure 6:
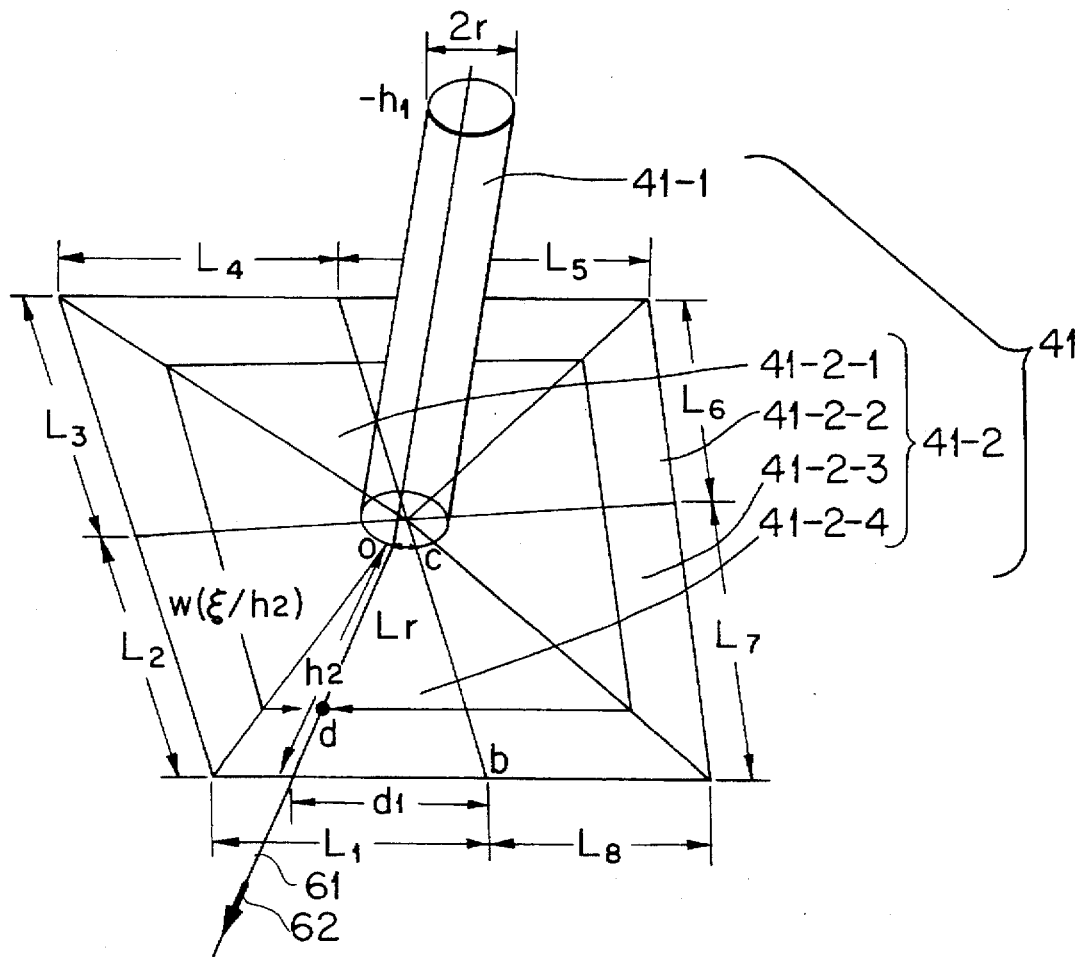
FIG. 6 is a diagram illustrating current paths on a radial dipole segment.

In the analysis of an antenna, as shown in FIG. 5, the vicinity of a junction of a linear conductor and a planar conductor is divided relying upon the moment method such that a center axis 52 of a linear conductor 51 passes through one of the vertexes of the quadrangular planar monopoles divided from a planar conductor 2. In the analysis of an antenna, as shown in FIG. 6, according to the invention, the current that flows through a radial dipole segment 41 is expanded. The radial dipole segment 41 includes a monopole 41-1 of a radius r and a radial monopole 41-2, and the radial monopole 41-2 is constituted by four quadrangles 41-2-1, 41-2-2, 41-2-3 and 41-2-4. A given current path on the radial dipole segment 41 is considered, and a current density at a given point d (shown in FIG. 6 on a quadrangle 41-2-4 that constitutes the radial monopole 41-2) on the current path is defined by an equation (5), as follows.

$$f(\xi) = \xi' \sin \{k(h_1 + \xi)\}/\{2\pi r \sin (kh_1)\} \quad : -h_1 \leq \xi \leq 0 \qquad (5)$$
$$f(\xi) = \xi' \sin \{k(h_2 - \xi)\}/\{w(\xi/h_2) \sin (kh_2)\} \quad : 0 < \xi \leq h_2$$

where ξ is a coordinate on a segment axis 61, i.e., a coordinate in the direction of flow of current and ξ' is a unit vector 62 in the direction of flow of current.

The direction of current is in parallel with the center axis of the monopole on the monopole 41-1, and the following equation (6) is satisfied on the radial monopole 41-2:

$$d_1/(L_1+L_2+L_3+L_4+L_5+L_6+L_7+L_8)=L_r/2\pi r \qquad (6)$$

where $d_1$ is the distance to the current path on the circumference of the radial monopole 41-2 when a given vertex b (one of the vertexes of the quadrangle 41-2-4 in FIG. 6) on the periphery of the radial monopole 41-2 is a starting point among vertexes of quadrangles constituting the radial monopole 41-2, and $L_r$ is a length from a starting point c on the circumference of the monopole 41-1 to a point at which a segment axis 61 intersects the circumference.

Here, b, c and a point at which the center axis of the monopole intersects the planar conductor are selected to be on a straight line. $w(\xi/h_2)$ is a length of a line connecting the points at which the distance from the circumference of the monopole 41-1 is "current path×ξ/$h_2$," on all current paths on the radial monopole 41-2. $h_2$ is a distance between a point on the circumference of the monopole 41-1 and a point at which the segment axis 61 intersects a quadrangle (quadrangle 41-2-4 in FIG. 6) that constitutes the radial monopole 41-2. The sizes of quadrangles constituting the radial monopole 41-2 are given by $L_1, L_2, L_3, L_4, L_5, L_6, L_7$ and $L_8$.

Self and mutual impedances are found for the radial segment dividing the vicinity of the junction of the linear conductor and the planar conductor, for the V-shaped dipole segment dividing the linear conductor, and for the planar dipole segment dividing the planar conductor, and are substituted into the equation (2). The matrix equation is then numerically solved to find a current distribution on the antenna.

Figure 7A:
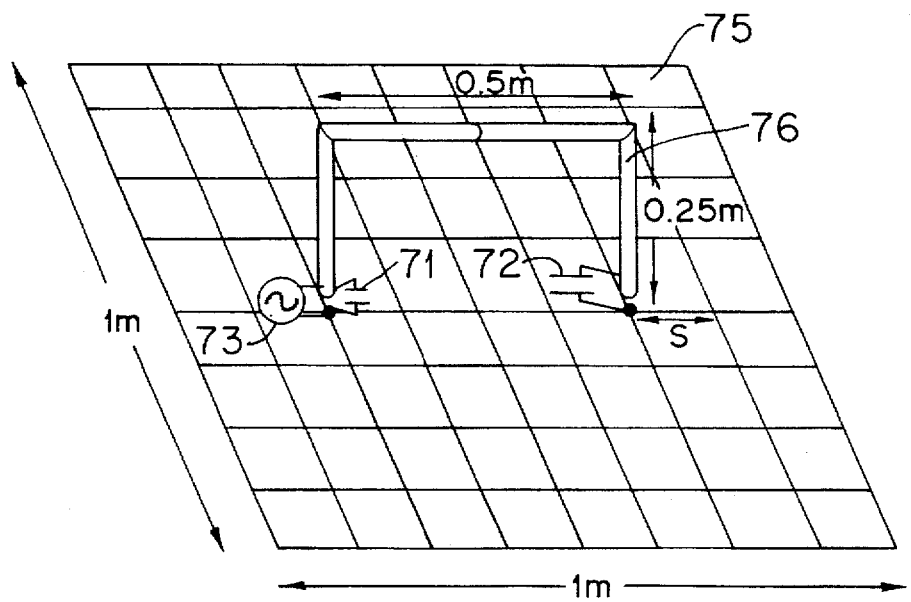
FIG. 7(a) is a diagram illustrating an example of a loop antenna to be analyzed according to an embodiment of the present invention.
Figure 7B:
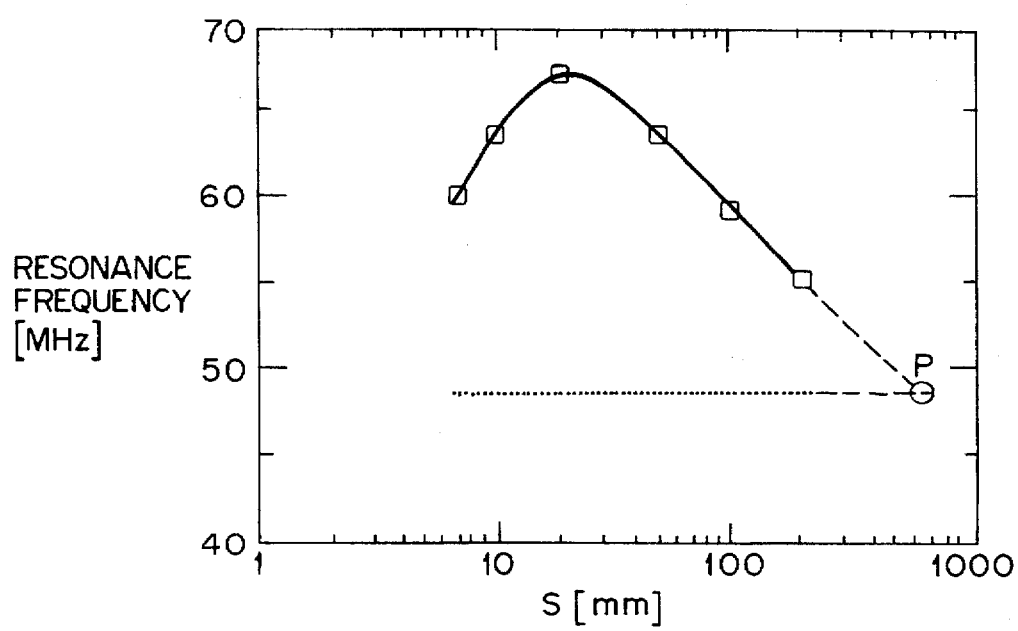
FIG. 7(b) is a diagram showing the resonance frequencies of a loop antenna resulting from a conventional analytical method.
Figure 8:
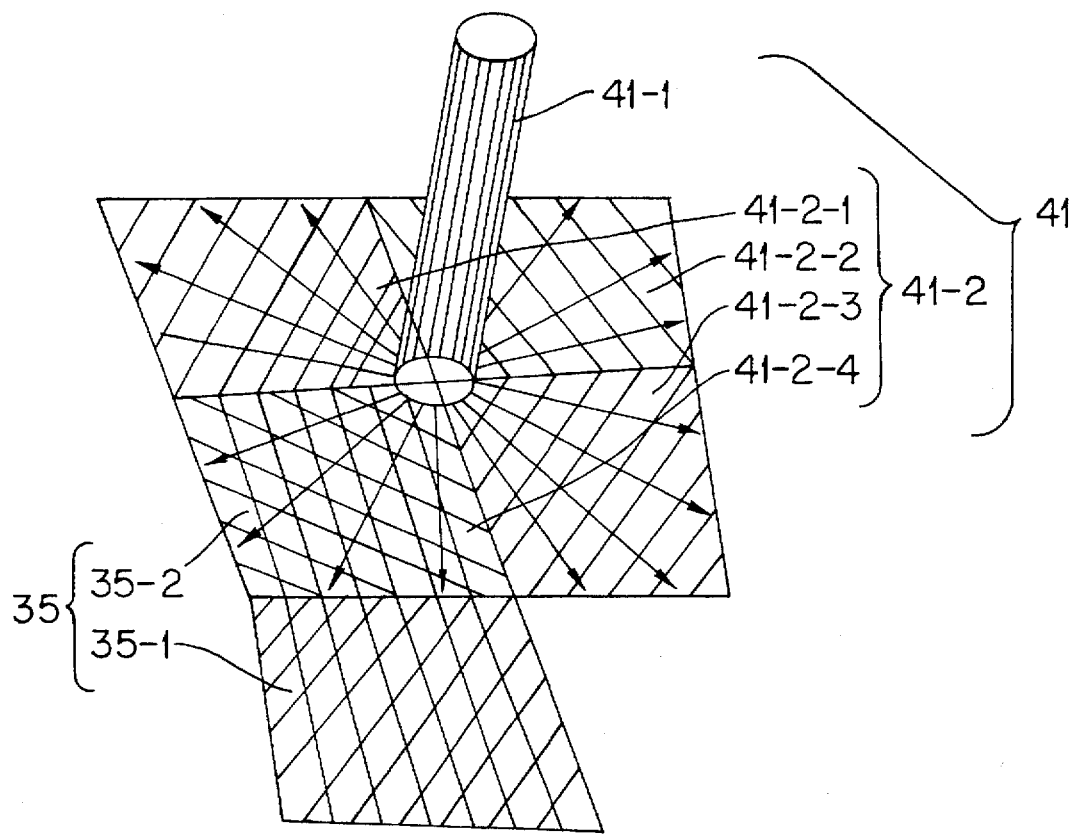
FIG. 8 is a diagram illustrating a radial segment overlapped on the planar dipole segment.

First, described below are the results of a numerical analysis of a loop antenna in which a linear conductor is connected to a conducting plane (finite ground plane) having a finite area according to a conventional method as shown in FIG. 8. FIG. 7(a) shows a loop antenna constituted by a square conducting plane 75 having a side of 1 meter and a U-shaped linear conductor 76 having a diameter of 4 mm. Capacitors 71 and 72 having a capacitance of 20 pF are connected in series between the conducting plane 75 and the linear conductor 76, and a current is fed from a feeding point 73. FIG. 7(b) is a diagram illustrates the resonance frequencies of the antenna of FIG. 7(a) when the length s of the side of the square planar monopole constituting the radial segment is changed.

In FIG. 7(b), the dotted line represents resonance frequencies of the antenna found relying upon the image theory, and the resonance frequency by the image theory is nearly 48 MHz ($\lambda \approx 6$ m), the region s=7 mm~200 mm corresponds to the region of s/$\lambda$ being 0.001~0.03.

In general, when the size of the ground plane is infinite, the resonance frequency of the antenna comes into agreement with a resonance frequency found relying upon the image theory. In the case of a finite ground plane having a size nearly the same as that shown in FIG. 7(a), the resonance frequency of the antenna comes nearly into agreement with a resonance frequency found relying upon the image theory. Therefore, if it is now considered that a value found by the image theory is a true value, it will be understood from FIG. 7(b) that the resonance frequency of the antenna is not in agreement with the resonance frequency found by the image theory.

When the electromagnetic wave emitted or received by the antenna has a wavelength $\lambda$, the resonance frequency of the antenna approaches the resonance frequency found by the image theory as the length s of the side of a square planar monopole is lengthened to be about 0.1$\lambda$. In FIG. 7(b), at the cross point P obtained by extrapolation the curve of the calculated resonance frequency values by the above mentioned conventional method and the curve of the calculated resonance frequency values by the image theory, the interpolated resonance frequency value is nearly 48 MHz ($\lambda \approx 6$ m) and s is nearly 600 mm, thus at the cross point P, s/$\lambda$ is nearly 0.1. As pointed out by Newman et al., this means that the radial monopole of the radial monopole segment must have a size of from 0.1 to 0.25$\lambda$.

In order to investigate the reason for why the antenna cannot be correctly analyzed when the side of the square planar monopole has a small length s, values of elements of the impedance matrix (2) were studied. It was learned that when the planar dipole segment 35 is overlapped on the radial monopole 41-2 as shown in FIG. 8, mutual impedance between the two is underestimated. Referring to FIG. 8, the planar monopole 35-2 constituting the planar dipole segment 35 is overlapped on the quadrangle 41-2-4 that constitutes the radial monopole 41-2. Though the planar monopole 35-2 and the quadrangle 41-2-4 exist at the same position in real space, the directions of the current flow paths defined thereby are not the same.

When the planar dipole segment is overlapped on the radial monopole, mutual impedance between the two is underestimated probably because the current flowing through the vicinity of the junction of the linear conductor and the planar conductor is not sufficiently expressed by the constitution of FIG. 8 since currents flowing on the two segments that are overlapped one upon the other are flowing in different directions. That is, the direction of current flow on the quadrangle 41-2-4 is different from that of the direction of current flow on the planar monopole 35-2.

When the planar dipole segment is overlapping the radial monopole of the radial dipole segment as shown in FIG. 8, therefore, a new planar dipole having a new planar monopole is used for linking the paths (directions) of currents flowing on each of the two planar monopoles of the two planar dipole segments. That is, according to the invention, an electric current is developed that flows through a new planar monopole constituted of a part in which the current flows in the same direction as the current flowing through part of the radial dipole segment 41 and a part in which the current flows in the same direction as the current flowing through part of the planar dipole segment 35.

Figure 9:
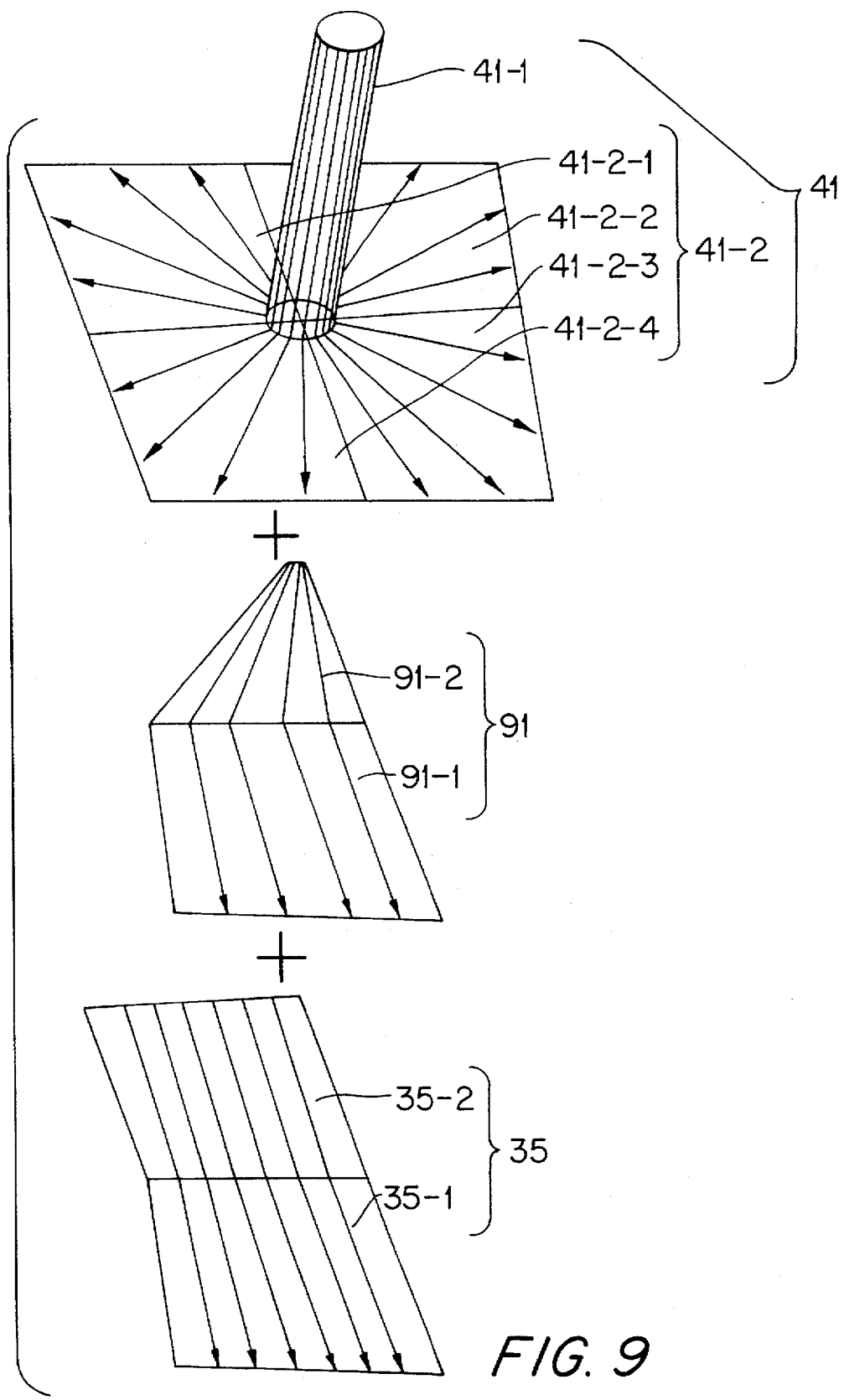
FIG. 9 is a diagram illustrating an example of a planar dipole segment according to the invention including a part in which the current flows in the same direction as the current flowing through part of the radial segment and a part in which the current flows in the same direction as the current flowing through part of the planar dipole segment.

Referring to FIG. 9, a planar dipole segment 91 of which the current flowing therethrough is expanded using another function, is constituted of a planar monopole 91-2 in which the current flows in the same direction as that of the current flowing through part of the quadrangle 41-2-4 that constitutes the radial dipole segment 41, and a planar monopole 91-1 in which the current flows in the same direction as the current flowing through the planar monopole 35-1 that constitutes the planar dipole segment 35. Here, the quadrangle 41-2-4 and the planar monopole 35-2 exist at the same position in real space, and the planar monopole 91-2 is part of the quadrangle 41-2-4. In the FIG. 9, the quadrangle 41-2-4 and planar monopole 35-2 and planar monopole 91-2 are shown separately in FIG. 9 for easy comprehension. Similarly, the planar monopole 35-1 and the planar monopole 91-1 exist at the same position in real space.

Figure 10:
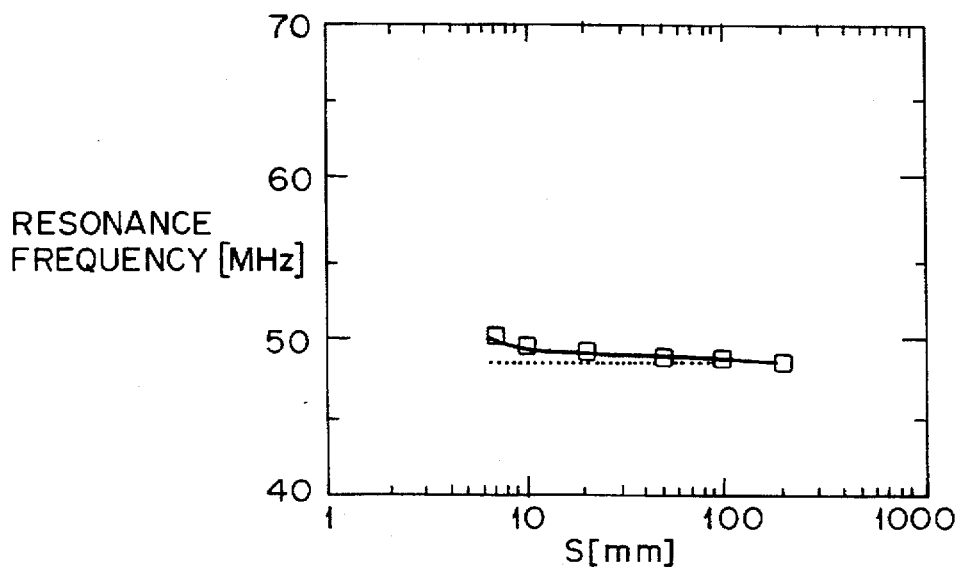
FIG. 10 is a diagram is a diagram showing the resonance frequencies of a loop antenna resulting from the analytical method of the present invention.

That is, in the vicinity of the junction of the linear conductor and the planar conductor, the current flowing through the vicinity of the junction is expressed by the overlapping of three dipole segments consisting of one radial dipole segment and two planar dipole segments. Use of this newly constituted planar dipole segment makes it possible to markedly improve the precision in calculating the currents flowing on the region of the junction between the linear conductor segment and the planar conductor segment. FIG. 10 illustrates the resonance frequency of the antenna varying with the length s of the side of the quadrangular planar monopole, which is one of the results of analysis of the antenna shown in FIG. 7(a). In FIG. 10, the dotted line represents the resonance frequencies of the antenna found according to the image theory. The resonance frequencies in a region s=7 mm$^{-200}$ mm is nearly 48 MHz ($\lambda \approx 6$ m). It will be understood that the resonance frequency is nearly in agreement with the resonance frequency found by the image theory even when the length s is greatly shortened to be about 10 mm (about 0.002$\lambda$). Thus, even when s/$\lambda$ is a very small value, for example s/$\lambda$=0.001~0.03, the resonance frequency is nearly in agreement with the resonance frequency found by the image theory (λ: the wavelength of the electromagnetic wave emitted or received by the antenna, s: the length of the side of square planar monopole.).

Figure 11A:
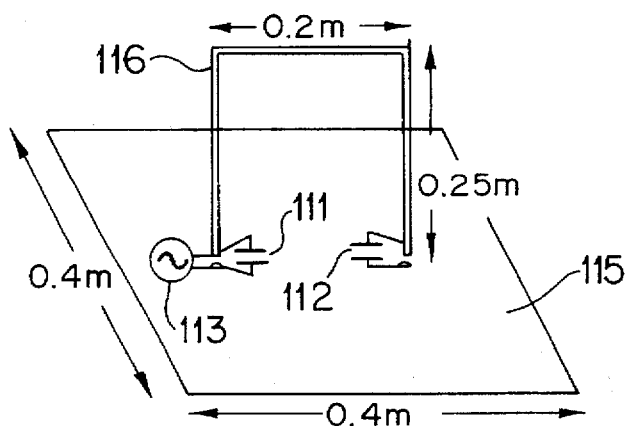
FIG. 11(a) is a diagram illustrating an input impedance of the loop antenna calculated by the analytical method of the present invention.

Described below is the comparison of the frequency characteristics of the input impedance of an antenna with the experimental values according to the present invention. FIG. 11(a) shows a loop antenna consisting of a square conducting plane 115 having a side of 0.4 meters and a U-shaped linear conductor 116 having a diameter of 4 mm. Capacitors 111 and 112 having a capacitance of 20 pF are connected in series between the conducting plane 115 and the linear conductor 116, and a current is supplied from a feeding point 113.

Figure 11B:
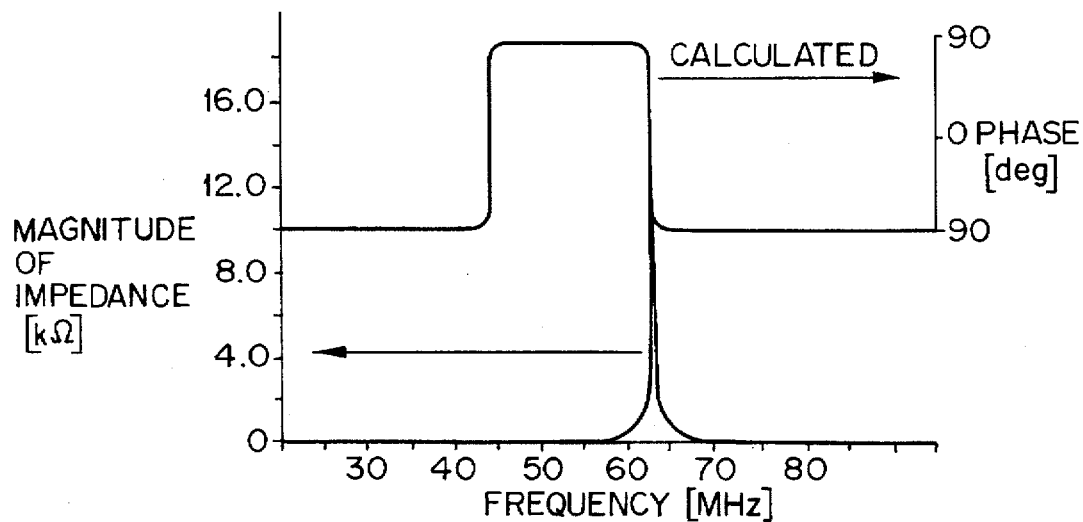
FIGS. 11(b) and 11(c) illustrate analyzed (calculated) results and experimental results of frequency characteristics of the input impedance of the loop antenna shown in FIG. 11(a) in comparison with the input impedance that is experimentally found.
Figure 11C:
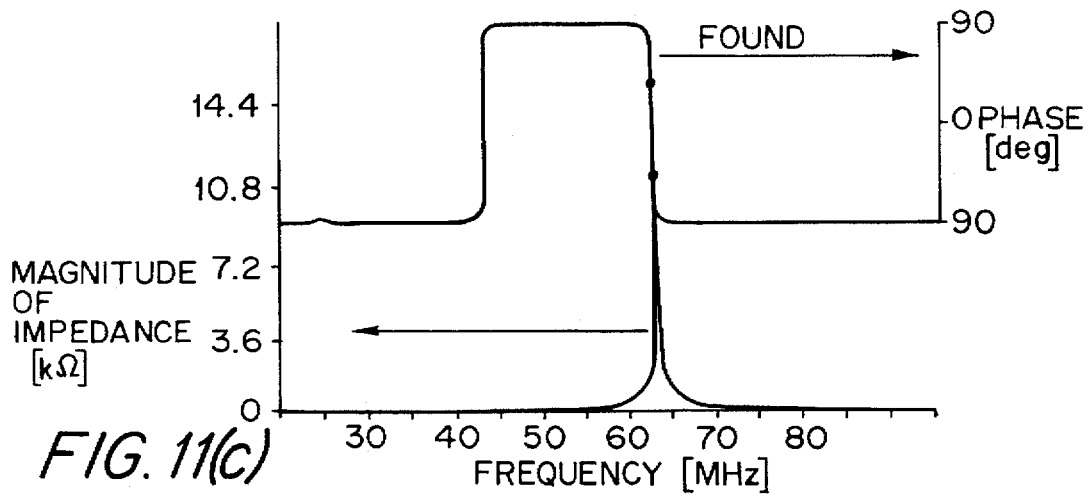

FIGS. 11(b) and 11(c) illustrate the analyzed (calculated) results and experimental results of the frequency characteristics of the input impedance of the loop antenna shown in Fig. 11(a) at 20 to 95 MHz. In the analysis, the loop antenna is divided into five V-shaped dipole segments, ninety-eight planar dipole segments and two radial dipole segments. Thus, the number of linear (V-shaped) dipole segments is $N_L=5$, the number of planar dipole segments is $N_P=98$, and the number of radial dipole segments $N_R=2$, and the total number of dipole segments in equation (2) is $N=NW+N_S+N_A=105$. In order to reduce the complexity of what's shown in the drawing, one hundred and five dipole segments are not shown in FIG. 11(a).

On each of the dipole segments, the predetermined current distribution function with normarized current intensity is assigned. For each of all of the possible two combinations of the one hundred and five dipole segments, the self or mutual impedance is calcuated, and the voltage for applying to each of the one hundred and five dipole segments is given, as a result, one hundred and five unknown electric current coefficients in equation (2) can be solved.

The current flowing on the loop antenna shown in FIG. 11(a) is determined from the calculated unknown current coefficients and the predetermined current distribution functions assigned for the dipole segments. The U-shaped linear conductor 116 is divided into six linear monopole sections (segments). Each of the five of the linear (V-shaped) dipole segments is obtained by overlapping adjacent two linear monopoles. One side of the square conductor plate 115 is divided into eight sections and another side of the square conductor plane 115 is divided into six sections, thus forty-eight planar monopole regions (segments) are obtained. Each of the eighty-two planar dipole segments are obtained by overlapping, in each direction of each of the sides of the square conductor plane, adjacent two planar monopole segments. Each of the radial monopoles connected to each end of the U-shaped linear conductor 116 consists of the four planar monopole segments of the square conductor plane 115, and is divided into the eight regions in the form of triangles having a common vertex to the eight triangles, thus the square conductor plate 115 is divided into 98 (=82+(8× 2)). One of the sixteen planar dipole segments corresponding to 91 in FIG. 9 consists of one of the regions in two of the eight regions each having the form of a triangle and the one region of the forty-eight planar monopole regions (segments).

In the example shown in FIG. 11, by the principle of this invention as shown in FIG. 9, in addition to the conventional method as shown in FIG. 8 in the prior art, the new sixteen dipole segments introduced in the analysis of the conductor having the junction of the U-shaped linear conductor 116 and the square conductor plane 115, as a result, the analysis results about the current distribution on the conductor having the junction of the linear conductor and the planar conductor can be calculated accurately. The calculation neglects the presence of the coaxial cable which is the conductor. In the experiment, the input impedance is measured by using a network analyzer through the coaxial cable of a length of 1.5 meters, and the effect of the cable at the input terminal of the antenna is corrected.

The resonance frequency of the antenna is calculated to be 62.875 MHz and is found to be 62.375 MHz, which are in agreement with each other with an error of not larger than 1%. Furthermore, the magnitude of the input impedance at a resonance frequency is calculated to be about 14.6 kΩ and is found to be about 15.2 kΩ, which are in agreement with each other with an error of not larger than 4%. From the above-mentioned comparison of the calculated values and the experimentally found values, it is ensured that the method of analysis (calculation method) according to the present invention is warrantable.

In the foregoing was described the case where the current flowing on the planar conductor was expanded as current paths flowing in two directions on the planar dipole segment. Even by using the moment method which expands the current on the planar conductor on the whole region, the antenna having a junction of a linear conductor and a planar conductor can be analyzed even when the radial monopole constituting the radial dipole segment has a size of not larger than 0.1 times the wavelength λ of the electromagnetic waves emitted from or received by the antenna by using a planar dipole segment which links the direction of current flowing on the planar conductor to the direction of current flowing through the radial dipole segment and by expanding the current that flows through the conductor.

Figure 12:
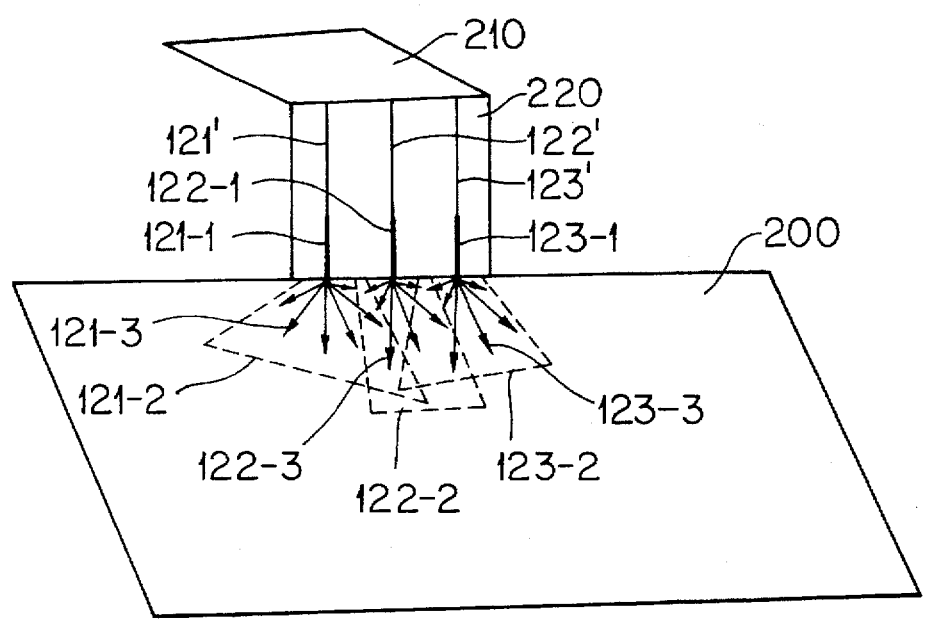
FIG. 12 is a diagram showing the current flowing through the vicinity of a junction of two planar conductors developed as currents flowing through a plurality of radial segments.

When the current flowing through the vicinity of the junction of the two planar conductors (220, 200) is expanded as currents flowing through a plurality of radial dipole segments 121, 122 and 123 as shown in FIG. 12, furthermore, the antenna having a junction of the two planar conductors (220, 200) can be analyzed by the moment method even when the size of the radial monopole of the radial dipole segment is not larger than 0.1λ by developing the current that flows through the conductor by using a planar dipole segment that links the paths (directions) of the current flowing on the planar conductor to the direction of the current flowing through the radial dipole segment.

In FIG. 12, each of the planar conductor planes (200, 210, 220) is in a different plane and the planar conductor 220 is assumed to be equivalent to three linear conductors 121', 122', 123'. Generally, the planar conductor (220) is assumed to be equivalent to a plurality of linear conductors. The radial dipole segment 121 consists of a linear monopole segment 121-1 and a radial monopole 121-2, and the radial dipole segment 122 consists of a linear dipole segment 122-1 and a radial monopole 122-2, and the radial dipole segment 123 consists of a linear monopole segment 123-1 and a radial monopole 123-2. Radial currents 121-3 flow on the radial monopole segment 121-2, radial currents 122-3 flow on the radial monopole segment 122-2, and radial currents 123-3 flow on the radial monopole segment 123-2. The linear monopole segment (121-1, 122-1, and 123-1) is connected to the side of the planar conductor 200.

As described above, when the electromagnetic waves emitted from or received by the antenna have a wavelength λ, even the antenna in which the planar conductor to which the linear conductor is joined has a size of not larger than about 0.2λ, which according to conventional methods was very difficult to analyze, can be analyzed by the moment method by developing the current that flows through the conductor by using a planar segment that links the direction of a current flowing on the planar conductor to the direction of a current that flows through the radial segment.

The above-mentioned analytical method is executed by an apparatus having at least a calculation means which calculates the equations (1) to (6) and a display means for displaying the calculated results. By utilizing the results of analysis, furthermore, the antenna can be designed and an optimum design structure can be determined.

Figure 13:
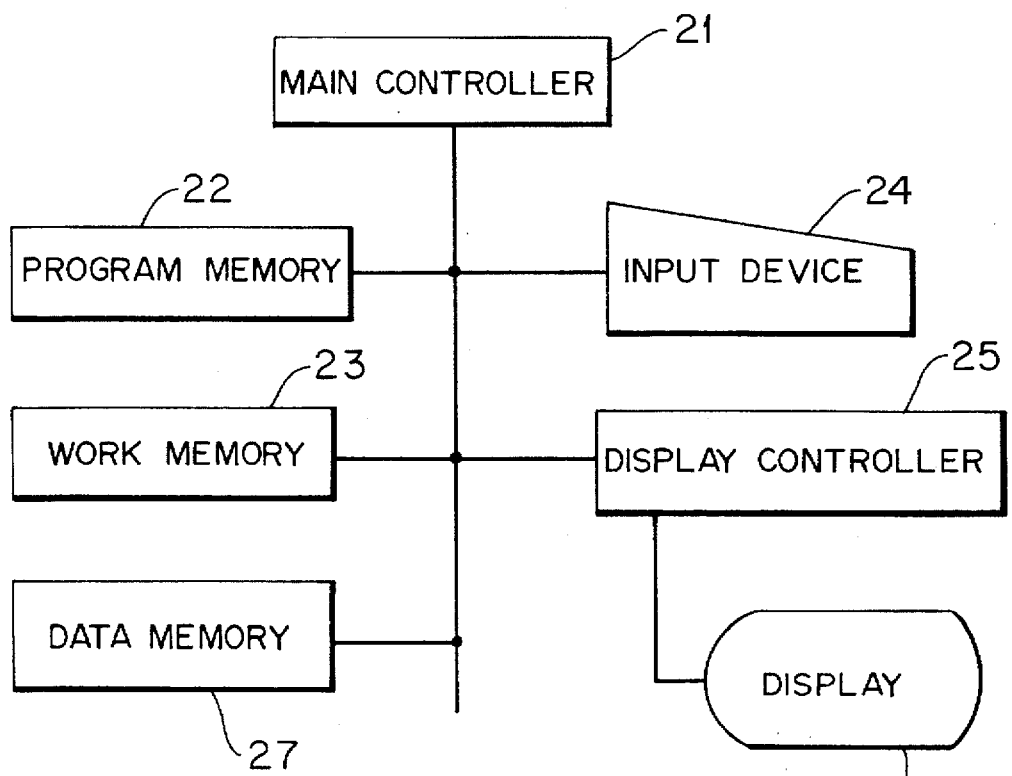
FIG. 13 is a diagram illustrating the configuration of a system of the present invention which includes an apparatus for executing the analytical method of the present invention.

FIG. 13 is a diagram illustrating a configuration of a system used to perform the analysis method of the present invention including an apparatus for performing the same, e.g. a computer. In FIG. 13, the procedure of calculation processing (software program) is input to a program memory 22, such as a data storage unit, hard disk, floppy disk memory, compact magnetic disk memory or compact optical disk memory or the like from an input device 24. The function by which the current flowing through the planar conductor is expanded, its position in real space, a function expressing a radial dipole segment and its position in real space, and a function expressing another segment linking the direction of the current that is expanded and flows through the planar conductor to the direction of the current flowing through the radial segment, and its position in real space, are read out from the data related to the antenna that is to be analyzed are stored in the data memory 27, in compliance with an instruction from the main controller 21, and equations (1) to (6) are calculated by a work memory 23. The calculated results are stored in the data memory 27. An instruction is sent to a display controller 25, and the calculated results are displayed on a display 26.

Described below is a method of designing an antenna. That is, input impedance as a function of frequency and magnitude distribution of the electric field are displayed on the display screen. Then, the length of antenna, arrangement of conductors constituting the antenna, and parameters such as capacitance of capacitors connected to the antenna, are varied so as to design an antenna having desired characteristics.

In the foregoing was described an embodiment in which the present invention was adapted to the loop antenna. The invention, however, can be adapted to all antennas that can be analyzed by the moment method using a radial segment, such as antennas for portable telephones. The above mentioned analytical method can be applied to calculate the current distribution of the current flowing on the conductor having plane and/or curved surfaces, and straight and/or curved lines. That is, it can be applied to the conductor having a curvature on the surface. Each of the curved lines of the conductor can be divided into a plurality of linear dipole segments each having a form of approximately a straight line, and each of the curved surfaces of the conductor can be divided into a plurality of planar dipole segments each having a form of approximately a planar surface. Furthermore, the conductor having a junction of the straight conductor with the curved surface (such as circular cylinder) and the plane surface is treated in the polar coordinate system, for calculating the current distribution of the current flowing on the conductor.

In modern electronic circuit boards, problems are often solved relying upon the antenna theory rather than the traditional circuit theory depending upon the frequency band of the transmission pulses and upon the size of the transmission line of the electrical network. The present invention can be adapted even for designing the wirings in electronic circuitry in which the surfaces of the electronic parts have surface wires, such as printed line wires and the like.

When the electromagnetic waves emitted from or received by the antenna have a wavelength $\lambda$, as described above, the present invention makes it possible to analyze, based on the moment method, even those antennas having a junction of a linear conductor and a planar conductor, and having an end of a conducting plane within a radius of $0.1\lambda$ from the junction of the linear conductor and the planar conductor.

We claim:

1. In a method of analyzing electromagnetics of an antenna, the method comprising the steps of:

dividing a conductor of an antenna, the conductor having a junction of a linear conductor and a planar conductor, into a plurality of dipole segments, the linear and planar conductors being placed in a different plane, wherein a current distribution function expressing a current in each of said dipole segments is expressed in a predetermined function, the plurality of dipole segments include a plurality of linear dipole segments divided from the linear conductor, a plurality of planar dipole segments divided from the planar conductor, and a radial dipole segment which includes a linear monopole connected to said junction and a radial monopole connected to said junction, adjacent ones of the linear dipole segments are overlapping, and adjacent ones of the planar dipole segments are overlapping, said linear monopole is the same conductor portion of a monopole of a linear dipole segment connected to said junction, said radial monopole is divided into a plurality of regions, one of the divided regions of said radial monopole is the same conductor portion of a first monopole of a first planar dipole segment connected to said junction;

transforming an integral equation relating to an electric field established on the surface of said conductor into simultaneous equations (1) for obtaining a current distribution of current flowing in said conductor of said antenna;

$$\sum_{i=1}^{N} Z_{ij}I_j = V_i \ (i=1, 2, \ldots, N) \quad (1)$$

wherein N is a number of said dipole segments, $Z_{i,j}$ is a self or mutual impedance between an I-th dipole segment and a j-th dipole segment, $I_j$ is an unknown electric current coefficient of current flowing in the j-th dipole segment, and $V_i$ is a voltage applied to the i-th dipole segment; and solving the simultaneous equations;

adding a second planar dipole segment to said plurality of dipole segments, wherein said second planar dipole segment includes a part of said one of the divided regions of said radial monopole and a second monopole of said first planar dipole segment, the second monopole is connected to the part of said one of the divided regions; and calculating a current distribution function expressing a current flowing in said second planar dipole segment from a current distribution function expressing a current flowing in said part of said one of the divided regions of said radial monopole and a current distribution function expressing a current flowing in said second monopole segment of said first planar dipole segment;

wherein the current distribution of current flowing in said conductor of said antenna is obtained using the unknown electric current coefficients of currents flowing in the dipole segments by solving the simultaneous equations.

2. A method according to claim 1, wherein the size of the planar dipole segment connected to a linear dipole segment in the region of the junction is not longer than $0.2\lambda$, where $\lambda$ is the wavelength of electromagnetic waves emitted from or received by the antenna.

3. A method according to claim 1, wherein the size of the radial monopole is not longer than $0.1\lambda$, where $\lambda$ is the wavelength of electromagnetic waves emitted from or received by the antenna.

4. A method according to claim 1, wherein an end of the planar dipole segment is within a radius of $0.1\lambda$ from the junction, where $\lambda$ is the wavelength of electromagnetic waves emitted from or received by the antenna.

5. A method according to claim 1, wherein a shape of each of said planar dipole segments is quadrangle, and a length of each side of each said quadrangle is not longer than $0.1\lambda$.

6. A method according to claim 1, wherein said radial monopole connected to said junction includes four planar monopoles each having a shape of a quadrangle, and a center axis of said radial monopole connected to said junction passes through a vertex common to the four quadrangles.

7. In a method of analyzing electromagnetics of an antenna, the method comprising the steps of:

dividing a conductor of an antenna, the conductor having junction of a first and a second planar conductors, into a plurality of dipole segments, the first and second planar conductors being placed in a different plane, wherein a current distribution function expressing a current in each of said dipole segments is expressed in a predetermined function, the plurality of dipole segments comprise a plurality of planar dipole segments divided from the first planar conductor, a plurality of linear dipole segments divided from a linear conductor which is assumed to be equivalent to the second planar conductor, and a radial dipole segment which includes a linear monopole connected to said junction and a radial monopole connected to said junction, adjacent ones of the linear dipole segments are overlapping, and adjacent ones of the planar dipole segments are overlapping, said linear monopole is the same conductor portion of a monopole of a linear dipole segment connected to said junction, said radial monopole is divided into a plurality of regions, one of the divided regions of said radial monopole is the same conductor portion of a first monopole of a first planar dipole segment connected to said junction;

transforming an integral equation relating to an electric field established on the surface of said conductor into simultaneous equations (1) for obtaining a current distribution of current flowing in said conductor of said antenna;

$$\sum_{i=1}^{N} Z_{ij}I_j = V_i (i=1, 2, \ldots, N) \quad (1)$$

wherein N is a number of said dipole segments, $Z_{i,j}$ is a self or mutual impedance between an i-th dipole segment and a j-th dipole segment, $I_j$ is an unknown electric current coefficient of current flowing in the j-th dipole segment, and $V_i$ is a voltage applied to the i-th dipole segment; and solving the simultaneous equations;

adding a second planar dipole segment to said plurality of dipole segments, wherein said second planar dipole segment includes a part of said one of the divided regions of said radial monopole and a second monopole of said first planar dipole segment, the second monopole is connected to the part of said one of the divided regions; and calculating a current distribution function expressing a current flowing in said second planar dipole segment from a current distribution function expressing a current flowing in said part of said one of the divided regions of said radial monopole and a current distribution function expressing a current flowing in said second monopole segment of said first planar dipole segment;

wherein the current distribution of current flowing in said conductor of said antenna is obtained using the unknown electric current coefficients of currents flowing in the dipole segments by solving the simultaneous equations.

8. In a method of analyzing electromagnetics, the method comprising the steps of:

dividing a conductor having a junction of a linear conductor and a planar conductor into a plurality of dipole segments, the linear and planar conductors being placed in a different plane, wherein a current distribution function expressing a current in each of said dipole segments is expressed in a predetermined function, the plurality of dipole segments comprise a plurality of linear dipole segments divided from the linear conductor, a plurality of planar dipole segments divided from the planar conductor, and a radial dipole segment which includes a linear monopole connected to said junction and a radial monopole connected to said junction, adjacent ones of the linear dipole segments are overlapping, and adjacent ones of the planar dipole segments are overlapping, said linear monopole is the same conductor portion of a monopole of a linear dipole segment connected to said junction, said radial monopole is divided into a plurality of regions, one of the divided regions of said radial monopole is the same conductor portion of a first monopole of a first planar dipole segment connected to said junction;

transforming an integral equation relating to an electric field established on the surface of said conductor into simultaneous equations (1) for obtaining a current distribution of current flowing in said conductor:

$$\sum_{i=1}^{N} Z_{ij}I_j = V_i (i=1, 2, \ldots, N) \quad (1)$$

wherein N is a number of said dipole segments, $Z_{i,j}$ is a self or mutual impedance between an i-th dipole segment and a j-th dipole segment, $I_j$ is an unknown electric current coefficient of current flowing in the j-th dipole segment, and $V_i$ is a voltage applied to the i-th dipole segment; and solving the simultaneous equations;

adding a second planar dipole segment to said plurality of dipole segments, wherein said second planar dipole segment includes a part of said one of the divided regions of said radial monopole and a second monopole of said first planar dipole segment, the second monopole is connected to the part of said one of the divided regions; and calculating a current distribution function expressing a current flowing in said second planar dipole segment from a current distribution function expressing a current flowing in said part of said one of the divided regions of said radial monopole and a current distribution function expressing a current flowing in said second monopole segment of said first planar dipole segment;

wherein the current distribution of current flowing in said conductor is obtained using the unknown electric current coefficients of currents flowing in the dipole segments by solving the simultaneous equations.

9. An improved apparatus for analyzing electromagnetics of an antenna, the apparatus comprising:

a memory device memorizing each of space coordinate positions of a plurality of dipole segments and each of a plurality of predetermined current distribution functions expressing a current in each of said dipole segments, wherein the plurality of dipole segments are divided from a conductor of an antenna, the conductor having a junction of a linear conductor and a planar conductor, the linear and planar conductors are placed in a different plane, and wherein the plurality of dipole segments comprise a plurality of linear dipole segments divided from the linear conductor, a plurality of planar dipole segments divided from the planar conductor, and a radial dipole segment which includes a linear monopole connected to said junction and a radial monopole connected to said junction, adjacent ones of the linear dipole segments are overlapping, and adjacent ones of the planar dipole segments are overlapping, said linear monopole is the same conductor portion of a monopole of a linear dipole segment connected to said junction, said radial monopole is divided into a plurality of regions, one of the divided regions of said radial monopole is the same conductor portion of a first monopole of a first planar dipole segment connected to said junction;

calculation unit solving simultaneous equations (1) for obtaining a current distribution of current flowing in said conductor of said antenna, wherein said simultaneous equations (1) are transformed from an integral equation relating to an electric field established on the surface of said conductor of said antenna:

$$\sum_{i=1}^{N} Z_{ij}I_j = V_i \, (i = 1, 2, \ldots, N) \quad (1)$$

wherein N is a number of said dipole segments, $Z_{i,j}$ is a self or mutual impedance between an i-th dipole segment and a j-th dipole segment, $I_j$ is an unknown electric current coefficient of current flowing in the j-th dipole segment, and $V_i$ is a voltage applied to the i-th dipole segment; and display means for displaying the results of calculation by the calculation unit;

said memory memorizes a space coordinate position of a second planar dipole segment in addition to said each of space coordinate positions of the plurality of dipole segments, wherein said second planar dipole segment includes a part of said one of the divided regions of said radial monopole and a second monopole of said first planar dipole segment, the second monopole is connected to the part of said one of the divided regions; and said calculation unit calculate a current distribution function expressing a current flowing in said second planar dipole segment from a current distribution function expressing a current flowing in said part of said one of the divided regions of said radial monopole and a current distribution function expressing a current flowing in said second monopole segment of said first planar dipole segment;

wherein the current distribution of current flowing in said conductor of said antenna is obtained using the unknown electric current coefficients of currents flowing in the dipole segments by solving the simultaneous equations.

10. An apparatus according to claim 9, wherein the size of a planar dipole segment connected to a linear dipole segment in the region of the junction is not larger than $0.2\lambda$, where $\lambda$ is the wavelength of electromagnetic waves emitted from or received by the antenna.

11. An apparatus according to claim 9, wherein the size of the radial monopole is not larger than $0.1\lambda$, where $\lambda$ is the wavelength of electromagnetic waves emitted from or received by the antenna.

12. An apparatus according to claim 9, wherein an end of the planar dipole segment is within a radius of $0.1\lambda$ from the junction, where $\lambda$ is the wavelength of electromagnetic waves emitted from or received by the antenna.

13. An apparatus according to claim 9, wherein a shape of each of said planar dipole segments is quadrangle, and a length of each side of each said quadrangle is not longer than $0.1\lambda$.

14. An apparatus according to claim 9, wherein said radial monopole connected to said junction includes four planar monopoles each having a shape of quadrangle, and a center axis of said radial monopole connected to said junction passes through a vertex common to the four quadrangles.

* * * * *